United States Patent
Kim et al.

(10) Patent No.: US 9,397,631 B2
(45) Date of Patent: Jul. 19, 2016

(54) FILTER CHIP ELEMENT AND METHOD OF PREPARING THE SAME

(71) Applicant: SAMSUNG ELECTRO-MECHANICS CO., LTD., Suwon-si, Gyeonggi-do (KR)

(72) Inventors: Yong Suk Kim, Suwon-si (KR); Sung Kwon Wi, Suwon-si (KR); Hyeog Soo Shin, Busan (KR); Sang Moon Lee, Suwon-si (KR); Young Seuck Yoo, Suwon-si (KR); Sung Jin Park, Busan (KR)

(73) Assignee: SAMSUNG ELECTRO-MECHANICS CO., LTD., Suwon, Gyunggi-do (KR)

( * ) Notice: Subject to any disclaimer, the term of this patent is extended or adjusted under 35 U.S.C. 154(b) by 52 days.

(21) Appl. No.: 14/078,317

(22) Filed: Nov. 12, 2013

(65) Prior Publication Data

US 2014/0132366 A1    May 15, 2014

(30) Foreign Application Priority Data

Nov. 13, 2012  (KR) .................. 10-2012-0128156

(51) Int. Cl.
  *H03H 7/01*   (2006.01)
  *H03H 1/00*   (2006.01)
  *H01F 17/00*  (2006.01)

(52) U.S. Cl.
  CPC ......... *H03H 7/0138* (2013.01); *H01F 17/0013* (2013.01); *H01F 2017/0066* (2013.01); *H01F 2017/0093* (2013.01); *H03H 1/0007* (2013.01)

(58) Field of Classification Search
  CPC .......... H03H 2001/0085; H03H 7/427; H03H 1/0007; H03H 7/0138; H01F 2017/0093; H01F 17/0013; H01F 2017/0066
  USPC .................................. 333/185, 184
  See application file for complete search history.

(56) References Cited

U.S. PATENT DOCUMENTS

| | | | | |
|---|---|---|---|---|
| 5,844,460 | A * | 12/1998 | Bogdan | H01F 37/00 333/140 |
| 2004/0246088 | A1* | 12/2004 | Shoji | C04B 35/265 336/200 |
| 2007/0131894 | A1* | 6/2007 | Takada | C01G 49/00 252/62.63 |
| 2007/0268093 | A1* | 11/2007 | Lim | H01L 23/5225 333/185 |
| 2011/0133854 | A1* | 6/2011 | Moon | H01C 7/10 333/185 |

FOREIGN PATENT DOCUMENTS

JP    2000-077222 A    3/2000

OTHER PUBLICATIONS http://www.microwaves101.com/encyclopedias/magnetic-materials; "Magnetic Materials"; Sep. 4, 2015.*

* cited by examiner

*Primary Examiner* — Robert Pascal
*Assistant Examiner* — Rakesh Patel
(74) *Attorney, Agent, or Firm* — McDermott Will & Emery LLP

(57) ABSTRACT

Disclosed herein is a filter chip element including a ferrite substrate, internal coil patterns formed on the ferrite substrate; and a ferrite composite layer filled between the internal coil patterns formed on the ferrite substrate, wherein the ferrite composite layer includes foaming resin, thereby increasing magnetic permeability and a Q value which are important characteristics of a filter chip element for noise prevention among electromagnetic shielding components.

15 Claims, 3 Drawing Sheets

- PRIOR ART -

FILTER CHIP ELEMENT AND METHOD OF PREPARING THE SAME

CROSS REFERENCE(S) TO RELATED APPLICATIONS

This application claims the benefit under 35 U.S.C. Section 119 of Korean Patent Application Ser. No. 10-2012-0128156, entitled "Filter Chip Element and Method of Preparing the Same" filed on Nov. 13, 2012, which is hereby incorporated by reference in its entirety into this application.

BACKGROUND OF THE INVENTION

1. Technical Field

The present invention relates to a filter chip element and a method of preparing the same.

2. Description of the Related Art

Recently, data transmitting and receiving functions of an electronic device such as a digital television (TV), a smart phone, and a notebook computer at a high frequency band have been widely used. Also, in the future, it is expected that multifunctional and compound electronic devices formed by connecting electronic devices to each other via a universal serial bus (USB) or other communication ports as well as a single electronic device are highly used.

In order to quickly transmit and receive data, data may be transmitted and received through as many as possible internal signal lines at a high frequency band of GHz moved from a previous frequency band of MHz.

When data is transmitted and received between a main device and a peripheral device at a high frequency band of GHz in order to transmit and receive a large amount of data, it is difficult to smoothly process the data due to signal delay and other interferences.

In particular, various port to port connections such as a communication line and an image and audio signal lines are used as in a digital TV, issues in terms of internal signal line delay and transmitting and receiving distortion may occur more frequently.

In order to overcome this problem, counter electromagnetic interference (EMI) components are disposed around connections between IT products and peripheral devices. Conventional wound and stack type counter EMI components have large sizes of chip elements and low electrical properties, and thus, may be used only in a limited region of a large size circuit board. However, due to the use of slimmed, miniaturized, compound, and multifunctional electronic devices, there is a need for counter EMI components satisfying these functions.

In order to form a conventional counter EMI component, ferrite powders and solvents, which have the same composite, a binder, other dispersants, or the like are mixed in a slurry form or a paste form, die casting or print process is performed on the resultant mixture to prepare green sheets, and then the green sheets are stacked to a desired thickness and are fired.

If necessary, during the firing, the green sheets are pressed with a predetermined weight. A fired substrate may have different thicknesses at an edge portion and a central portion, may be bent, and may break or crack due to weak shock Thus, it is not appropriate to use the fired substrate as a ferrite substrate for EMI and electromagnetic compatibility (EMC), such as a common mode filter product.

Firing density of the fired substrate locally varies. Air voids are formed in a non-fired portion. Thus, chemical solutions used in photolithography penetrate into the fired substrate, thereby causing internal air voids or erosion.

A ferrite substrate used in a thin film type common mode filter is formed by forming internal conductive patterns on a fired base substrate by photolithography process and then mixing ferrite and resin to form a ferrite composite layer thereon. However, the ferrite composite layer has lower magnetic permeability and a lower Q value than the fired ferrite substrate formed on a lower portion, thereby causing impedance reduction of actual chip characteristic.

The ferrite composite layer requires dispersibility of ferrite powders and resin, adhesion therebetween, and the like.

Conventional ferrite resin has low dispersibility, difficulty in control of powder particle sizes, and low adhesion between interfaces, and thus, a resin layer formed of the ferrite resin may crack and have low deformation strength, thereby causing dimension error. Thus, due to the dimension error, magnetic permeability and a Q value which are important characteristics of an inductor chip element are reduced.

It is difficult to form an internal circuit required to obtain various functions with a small area in order to satisfy miniaturization of internal conductive patterns, and thus, there is a limit in using conventional wound and stack type noise filters in an electronic component. Accordingly, there is a need to manufacture a thin film type common mode filter in order to address the problems of wound and stack type common mode filters.

As shown in FIG. 1, the thin film type common mode filter is manufactured by forming an insulating layer 20 including an organic material on a fired ferrite substrate 10, forming conductive patterns 30 thereon and then mixing organic resin and ferrite powders to form a ferrite composite layer 40.

RELATED ART DOCUMENT

Patent Document (Patent Document 1) Japanese Patent Laid-Open Publication No. 2000-077222

SUMMARY OF THE INVENTION

An object of the present invention is to provide a filter chip element that prevents noise in both a common mode and a differential mode and has increased magnetic permeability and impedance value.

Another object of the present invention is to provide a method of preparing the filter chip element.

According to an exemplary embodiment of the present invention, there is provided a filter chip element including a ferrite substrate, internal coil patterns formed on the ferrite substrate, and a ferrite composite layer filled between the internal coil patterns formed on the ferrite substrate, wherein the ferrite composite layer includes foaming resin.

The foaming resin may include at least one selected from the group consisting of N-isopropyl acrylamide (NIPAM), hydroxyethyl acrylate (HEMA), polyvinylidenefluoride (PVDF), polymethylsilicone (PMS), polycarbosilane (PCS), polyurethane resin, polybutadiene resin, and copolymer thereof.

The foaming resin may be one component type resin or two component type resin.

The ferrite composite layer may further include oxide powder.

The oxide powder may include at least two metal oxides selected from the group consisting of iron (Fe), copper (Cu), nickel (Ni), zinc (Zn), cobalt (Co), and silicon (Si).

The oxide powder may have a spherical shape and an average diameter thereof is 5 to 45 µm.

The ferrite composite layer may include the oxide powder and the foaming resin with a ratio of 60 to 80 wt %:40 to 20 wt %.

The ferrite composite layer may have a structure in which the oxide powder is inserted into pores of the foaming resin.

The filter chip element may further include 3 to 10 wt % of silicon resin based on the foaming resin.

The filter chip element may further include 2 to 5 wt % of carbon-based material based on the foaming resin.

The filter chip element may further include a reinforcing layer formed on the ferrite composite layer.

The reinforcing layer may be formed of at least one selected from the group consisting of silicon resin, carbon-based material, and a nitride material.

The internal coil patterns may be formed of copper (Cu) or aluminum (Al).

The internal coil patterns may be spaced apart from an outer edge of the ferrite substrate by a distance of 40 to 100 μm.

The ferrite substrate may be formed of iron (Fe) as a main material and use a material having magnetic permeability of 100 or more.

According to another exemplary embodiment of the present invention, there is provided a method of preparing a filter chip element, the method including forming internal coil patterns on a ferrite substrate; impregnating the ferrite substrate whereon the internal coil patterns are formed with foaming resin; semi-hardening the foaming resin to form pores in the foaming resin; inserting oxide powder into the pores of the foaming resin; and completely-hardening the foaming resin into which the oxide powder is inserted.

The foaming resin may include at least one selected from the group consisting of N-isopropyl acrylamide (NIPAM), hydroxyethyl acrylate (HEMA), polyvinylidenefluoride (PVDF), polymethylsilicone (PMS), polycarbosilane (PCS), polyurethane resin, polybutadiene resin, and copolymer thereof.

The semi-hardening of the foaming resin may be performed at a temperature of 80 to 100° C.

The oxide powder may include at least two metal oxides selected from the group consisting of iron (Fe), copper (Cu), nickel (Ni), zinc (Zn), cobalt (Co), and silicon (Si).

The completely-hardening of the foaming resin may be performed at a temperature of 150 to 200° C.

The foaming resin of the ferrite composite layer may further include a reinforcing agent including at least one selected from silicon resin, carbon-based material, and a nitride material.

The method may further include forming a reinforcing layer on the ferrite composite layer.

The reinforcing layer may be formed of at least one selected from the group consisting of silicon resin, carbon-based material, and a nitride material.

DESCRIPTION OF THE PREFERRED EMBODIMENTS

Hereinafter, exemplary embodiments will be described in detail with reference to the accompanying drawings so that they can be easily practiced by those skilled in the art to which the present invention pertains.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

The present invention relates to a filter chip element and a method of preparing the same.

Figure 1:
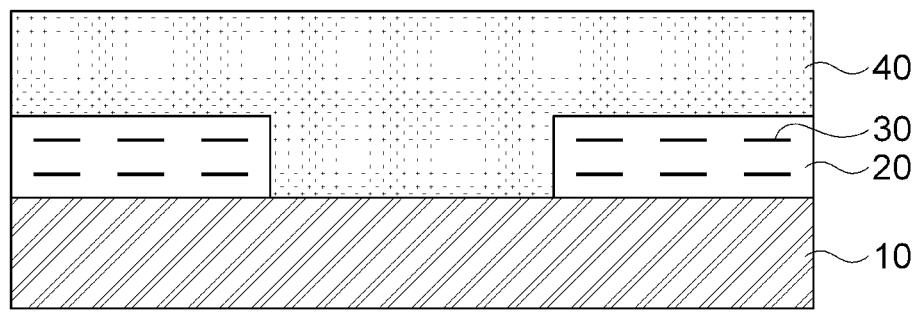
FIG. 1 is a cross-sectional view of a general thin film type electromagnetic interference (EMI) device.
Figure 2:
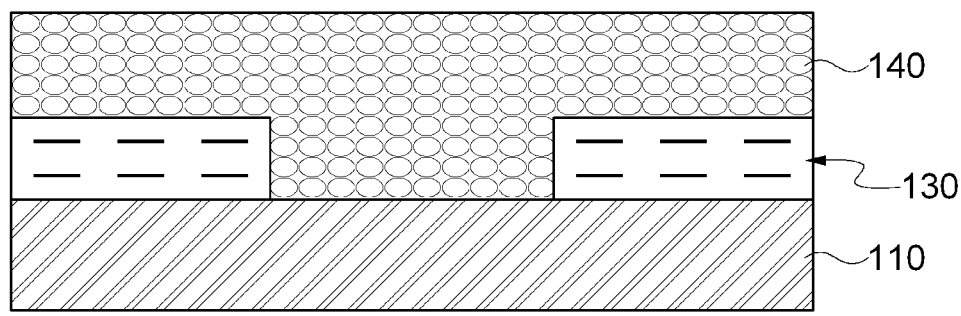
FIGS. 2 to 7 are cross-sectional views of structures of filter chip elements according to embodiments of the present invention.

As shown in FIG. 2, a filter chip element according to an embodiment of the present invention includes a ferrite substrate 110, internal coil patterns 130 formed on the ferrite substrate 110, a ferrite composite layer 140 filled between the internal coil patterns 130 formed on the ferrite substrate 110. Here, the ferrite composite layer 140 includes foaming resin.

The term "ferrite composite layer" used in the specification includes foaming resin and oxide powder.

In general, a ferrite composite layer of a filter chip element includes polymer resin and ferrite powder. In order to form the ferrite composite layer, miscibility between the ferrite powder and the polymer resin is important, and ferrite powder particles need to be uniformly dispersed in the polymer resin.

To this end, according to the present invention, in order to address problems in terms of reduction in magnetic permeability caused by non-uniform dispersion of powers and resin due to epoxy or polyimide as conventional polymer resin, the foaming resin instead of the polymer resin such as epoxy or polyimide may be used to quickly form constant spherical holes with a small size.

The foaming resin is resin that foams therein at a predetermined temperature, and for example, may include at least one selected from the group consisting of N-isopropyl acrylamide (NIPAM), hydroxyethyl acrylate (HEMA), polyvinylidenefluoride (PVDF), polymethylsilicone (PMS), polycarbosilane (PCS), polyurethane resin, polybutadiene resin, and copolymer thereof.

The foaming resin may be one component type resin or two component type resin and may be repeatedly cured according to the type of the foaming resin.

The ferrite composite layer 140 may use the oxide powder together with the foaming resin.

Accordingly, the ferrite composite layer 140 has a structure in which the oxide powder is inserted into the pores of the foaming resin. The oxide powder is inserted into the pores of the foaming resin, thereby preventing the oxide powder from colliding with each other and being aggregated, which causes aggregation.

Accordingly, according to the present invention, the oxide powder may use spherical metal oxides instead of flake type oxide. The oxide powder particles may have an average diameter of 5 to 45 μm, preferably, 20 to 30 μm.

The oxide powder may include at least two metal oxides selected from the group consisting of iron (Fe), copper (Cu), nickel (Ni), zinc (Zn), cobalt (Co), and silicon (Si). For example, Fe oxide mixed with at least two oxide powders selected from the group consisting of Cu oxide, Ni oxide, Zn oxide, Co oxide, and Si oxide may be used.

The ferrite composite layer may include the oxide powder and the foaming resin with a ratio of 60 to 80 wt %:40 to 20 wt %. When the oxide powder and the foaming resin exceeds the range, problems may arise with insertion of the oxide powder into the foaming resin, dispersibility may decrease due to difference in a specific surface area, and adhesion may decrease due to air voids between the oxide powder and the foaming resin.

As described above, ferrite composite layer is formed, thereby preventing failure caused by magnetic permeability reduction and deformation and crack of the layer due to non-uniform mixture between conventional ferrite powder and polymer resin.

The ferrite composite layer 140 may be filled between the internal coil patterns 130 formed on the ferrite substrate 110. As shown in FIG. 2, an end surface of each of the internal coil patterns 130 may be formed to correspond to an outer edge of the ferrite substrate 110.

Figure 3:
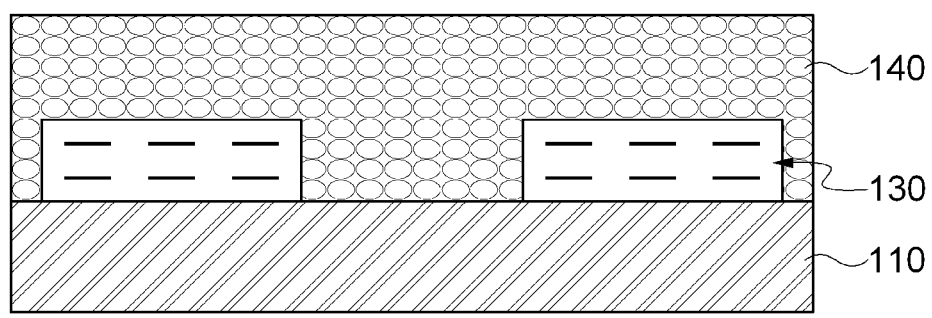

According to an embodiment of the present invention, as shown in FIG. 3, the internal coil patterns 130 may be spaced apart from the outer edge of the ferrite substrate 110 by 40 to 100 μm.

Thus, as shown in FIG. 3, when the internal coil patterns 130 are spaced apart from the outer edge of the ferrite substrate 110 by a predetermine distance, the ferrite composite layer 140 may be filled in the space. In this case, a filter chip element with high reliability may be prepared by improving low contraction percentage of the outer edge of the ferrite substrate 110, increasing firing density and strength of the ferrite substrate 110, and preventing heat and moisture from penetrating into the outer edge of the ferrite substrate 110 at high temperature and high humidity.

Figure 4:
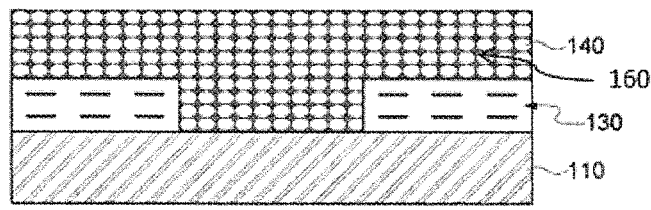
Figure 5:
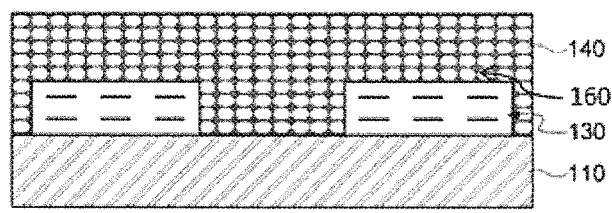

In addition, according to an embodiment of the present invention, in order to reinforce ferrite composite and to compensate for the magnetic permeability reduction, a reinforcing agent 160 may be added to the foaming resin of the ferrite composite layer 140, as shown in FIGS. 4 and 5.

The reinforcing agent may be selected from silicon resin, carbon-based material, and a nitride material. Examples of the carbon-based material may include carbon nanotube (CNT), carbon nano fiber (CNF), carbon fiber, graphene, and diamond like carbon (DLC). When the carbon-based material is used, the ferrite composite may have excellent mechanical properties such as tensile strength and elongation percentage.

In general, silicon resin has high magnetic permeability and thermal stability to prevent thermal oxidation of chip elements, and thus, may be used to form a reinforcing layer of the ferrite composite in order to maintain high reliability.

When the reinforcing agent is silicon resin, the foaming resin may include 3 to 10 wt % of the reinforcing agent based on the foaming resin. When the reinforcing agent is a carbon-based compound, the foaming resin may include 2 to 5 wt % of the reinforcing agent based on the foaming resin.

Figure 6:
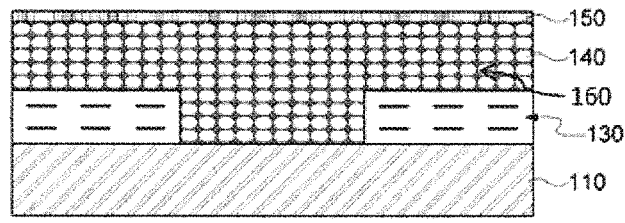
Figure 7:
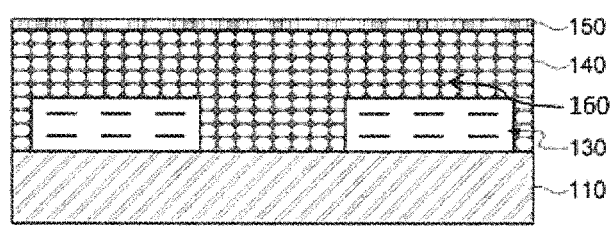

The reinforcing agent 160 may be added to the foaming resin of the ferrite composite layer 140. As shown in FIGS. 6 and 7, a separate reinforcing layer 150 may be formed on the ferrite composite layer 140.

The reinforcing layer 150 may be formed of at least one selected from the group consisting of silicon resin, carbon-based material, and a nitride material. The reinforcing layer 150 may have a thickness of 0.5 to 2 μm in order to reinforce intensity and to prevent deformation.

The internal coil patterns 130 of the filter chip element according to the present invention may be formed of Cu or Al.

The ferrite substrate 110 of the filter chip element according to the present invention may be formed of Fe as a main material and may use a material having magnetic permeability of 100 or more.

A method of preparing a filter chip element according to an embodiment of the present invention may include forming internal coil patterns on a ferrite substrate, impregnating the ferrite substrate whereon the internal coil patterns are formed with foaming resin, semi-hardening the foaming resin to form pores in the foaming resin, inserting oxide powder into the pores of the foaming resin, and completely-hardening the foaming resin into which the oxide powder is inserted.

First, the internal coil patterns are formed on the ferrite substrate. Here, the internal coil patterns are formed to be insulated by epoxy resin or the like.

Then, the foaming resin is coated and impregnated on the ferrite substrate whereon the internal coil patterns are formed. The foaming resin may be coated and impregnated on the ferrite substrate by filling between the internal coil patterns formed on the ferrite substrate. That is, as shown in FIG. 2, when the end surface of each internal coil pattern is formed to correspond to the outer edge of the ferrite substrate, the foaming resin is disposed on the internal coil patterns and is filled in a space therebetween only. As shown in FIG. 3, when the internal coil patterns are spaced apart from the outer edge of the ferrite substrate by a predetermined distance, the foaming resin is disposed on upper and side surfaces of the internal coil patterns and is filled between a space therebetween.

Then, the foaming resin is semi-hardened at a temperature of 80 to 100° C. to form pores in the foaming resin. Metal oxide powder is inserted into the pores of the foaming resin with a sprayer or a squeeze.

The oxide powder may include at least two metal oxides selected from the group consisting of Fe, Cu, Ni, Zn, Co, and Si. The oxide powder may each have a spherical shape for easy insertion of the metal oxide powder.

The foaming resin may further include at least one reinforcing agent selected from silicon resin, carbon-based material, and a nitride material.

The oxide powder is inserted into the foaming resin and are completely hardened at a temperature of 150 to 200° C. Thus, the metal oxide powder is inserted into the pores of the foaming resin so as to be uniformly filled in the pores.

The foaming resin may include at least one selected from the group consisting of N-isopropyl acrylamide (NIPAM), hydroxyethyl acrylate (HEMA), polyvinylidenefluoride (PVDF), polymethylsilicone (PMS), polycarbosilane (PCS), polyurethane resin, polybutadiene resin, and copolymer thereof.

The foaming resin may be completely hardened at a temperature of 150 to 200° C. In addition, the foaming resin may be one component type resin or two component type resin. Thus, a hardening process may differ according to the type of the foaming resin.

When the ferrite composite layer is formed, a reinforcing layer may be selectively formed on the ferrite composite layer.

The reinforcing layer may be formed of at least one selected from the group consisting of silicon resin, carbon-based material, and a nitride material.

Hereinafter, exemplary embodiments of the present invention will be described in detail with reference to the following examples. However, these examples are not intended to limit the purpose and scope of embodiments of the present invention. In addition, predetermined compounds are used in the following examples, but it will be understood by one of ordinary skill in the art that the same or similar advantages may be obtained by equivalents of the compounds.

Example 1

As shown in FIG. 3, primarily, foaming resin, NIPAM was impregnated on an upper or side surfaces of Cu internal coil patterns of a ferrite substrate whereon internal coil patterns are formed using Cu and was semi-hardened at a temperature of 130° C. to form pores in the foaming resin.

Spherical oxide powder (Fe oxide+Cu and Ni oxide, and average diameter of 5 to 45 μm) was inserted into the pores formed in the foaming resin by a squeeze with a ratio of foaming resin:oxide powder=30 wt %:70 wt %.

Then, the resultant was completely hardened at a temperature of 170° C. to prepare a filter chip element including a ferrite composite layer.

Example 2

A filter chip element including a ferrite composite layer was prepared using the same manner as in Example 1 except that the filter chip element includes 10 wt % of silicon resin based on the foaming resin.

Example 3

A filter chip element was prepared using the same manner as in Example 1 except that a reinforcing layer including 2 wt % of CNT powder based on foaming resin, having excellent electromagnetic shielding properties and excellent magnetic permeability was formed on the ferrite composite layer so as to have a structure shown in FIG. 7.

Comparative Example 1

A ferrite composite layer was formed of epoxy resin and Fe—Ni—Zn—Cu as conventional ferrite powder to prepare filter chip element having a structure shown in FIG. 2.

Experimental Example 1

Measurement of Impedance

Figure 8:
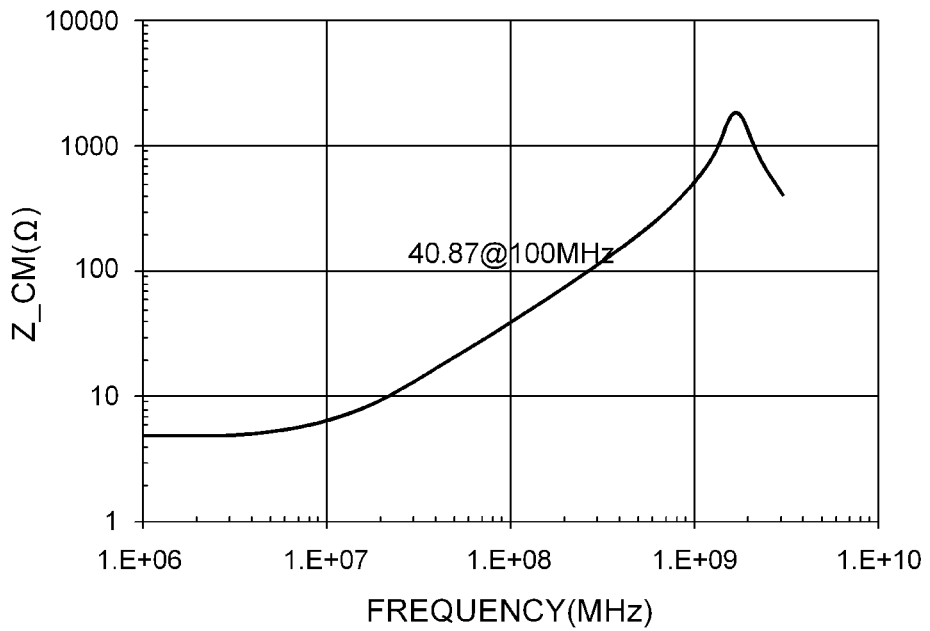
FIG. 8 is a graph showing a measurement result of impedance according to Comparative Example 1.
Figure 9:
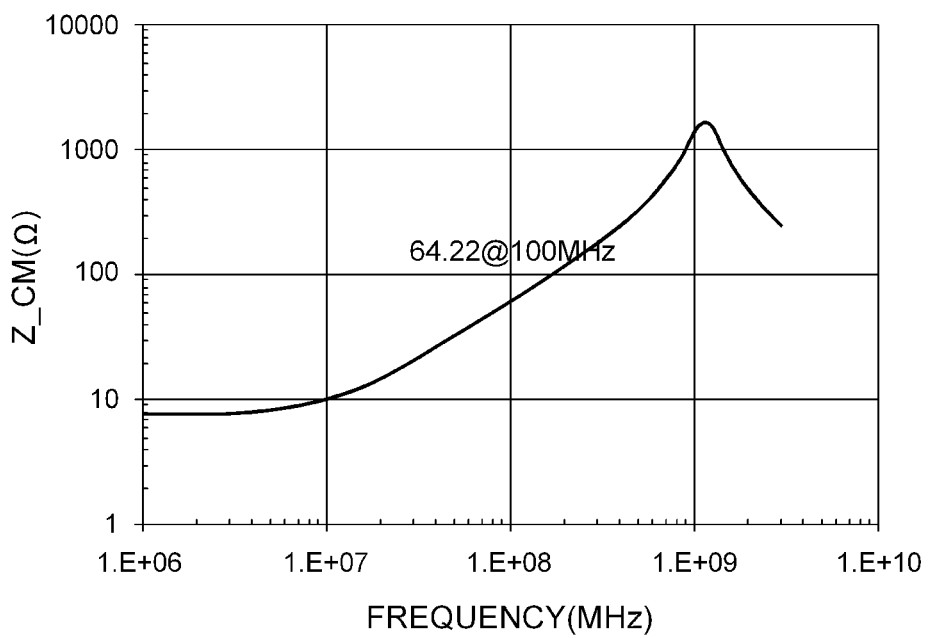
FIG. 9 is a graph showing a measurement result of impedance according to Example 1.

Relative impedance fluctuations of the filter chip elements prepared in Comparative Example 1 and Example 1 were measured, and the measurement result is shown in FIGS. 8 and 9.

As shown in FIG. 8, common mode impedance in a conventional structure of Comparative Example 1 is 40.87 Ω at a frequency of 100 MHz, but common mode impedance in a structure of Example 1 according to the present invention is 64.22 Ω at a frequency 100 MHz, which is higher by about 57% than in the conventional structure.

Experimental Example 2

Measurement of Magnetic Permeability and Q Value

The magnetic permeability and Q values of the filter chip elements prepared in Comparative Example 1 and Example 1 were measured, and the measurement result is shown in Table 1 below.

TABLE 1

|  | Magnetic permeability | Q |
| --- | --- | --- |
| Comparative Example 1 | 6.17 | 34 |
| Example 1 | 12.89 | 49 |
| Example 2 | 11.28 | 65.4 |
| Example 3 | 12.35 | 47 |

As seen from Table 1 above, compared with the magnetic permeability and Q value of a conventional filter chip element, the magnetic permeability and Q value of the filter chip element according to the present invention are improved.

As seen from the above results, epoxy resin is replaced with foaming resin in a ferrite composite layer of the conventional filter chip element, oxide powder is inserted into pores of the foaming resin, thereby increasing magnetic permeability and a Q value which are important characteristics of a filter chip element for noise prevention.

According to the present invention, a filter chip element with high reliability may be prepared by improving low contraction percentage of the outer edge of the ferrite substrate, increasing firing density and strength of the ferrite substrate, and preventing heat and moisture from penetrating into the outer edge of the ferrite substrate at high temperature and high humidity.

In addition, magnetic permeability and a Q value which are important characteristics of a filter chip element for noise prevention among electromagnetic shielding components may be improved.

Adhesion between external electrode patterns and a substrate may be increased and surface flatness of the substrate may be uniformly maintained, and thus, it may be possible to prepare counter EMI and EMC components requiring a plurality of layers. A common mode filter requiring high impedance may be easily manufactured and mass production thereof may be obtained due to simple processes.

Although the preferred embodiments of the present invention have been disclosed for illustrative purposes, those skilled in the art will appreciate that various modifications, additions, and substitutions are possible, without departing from the scope and spirit of the invention as disclosed in the accompanying claims. Accordingly, such modifications, additions, and substitutions should also be understood to fall within the scope of the present invention.

What is claimed is:

1. A filter chip element, comprising:
    a ferrite substrate;
    internal coil patterns formed on the ferrite substrate; and
    a ferrite composite layer filled between the internal coil patterns,
    wherein the ferrite composite layer includes a foaming resin and a reinforcing material mixed with the foaming resin, and the reinforcing material is selected from the group consisting of silicon resin, carbon-based material, and a nitride material.

2. The filter chip element according to claim 1, wherein the foaming resin includes at least one selected from the group consisting of N-isopropyl acrylamide (NIPAM), hydroxyethyl acrylate (HEMA), polyvinylidenefluoride (PVDF), polymethylsilicone (PMS), polycarbosilane (PCS), polyurethane resin, polybutadiene resin, and copolymer thereof.

3. The filter chip element according to claim 1, wherein the foaming resin is a one component type resin or a two component type resin.

4. The filter chip element according to claim 1, wherein the ferrite composite layer further includes an oxide powder.

5. The filter chip element according to claim 4, wherein the oxide powder includes at least two metal oxides selected from the group consisting of iron (Fe), copper (Cu), nickel (Ni), zinc (Zn), cobalt (Co), and silicon (Si).

6. The filter chip element according to claim 4, wherein the oxide powder has a spherical shape and an average diameter thereof is 5 to 45 µm.

7. The filter chip element according to claim 4, wherein the ferrite composite layer includes the oxide powder and the foaming resin with a ratio of 60 to 80 wt %:40 to 20 wt %.

8. The filter chip element according to claim 4, wherein the ferrite composite layer has a structure in which the oxide powder is inserted into pores of the foaming resin.

9. The filter chip element according to claim 1, wherein the reinforcing material is the silicon resin which weighs 3 to 10 wt % of the weight of the foaming resin.

10. The filter chip element according to claim 1, wherein the reinforcing material is the carbon-based material which weighs 2 to 5 wt % of the weight of the foaming resin.

11. The filter chip element according to claim 1, further comprising a reinforcing layer formed on the ferrite composite layer.

12. The filter chip element according to claim 11, wherein the reinforcing layer is formed of at least one selected from the group consisting of silicon resin, carbon-based material, and a nitride material.

13. The filter chip element according to claim 1, wherein the internal coil patterns are formed of copper (Cu) and aluminum (Al).

14. The filter chip element according to claim 1, wherein the internal coil patterns are spaced apart from an outer edge of the ferrite substrate by a distance of 40 to 100 µm.

15. The filter chip element according to claim 1, wherein the ferrite substrate is formed of an oxide which comprises iron (Fe) as a main material and has a magnetic permeability of 100 or more.

* * * * *